(12) United States Patent
Wunnicke et al.

(10) Patent No.: US 8,847,466 B2
(45) Date of Patent: Sep. 30, 2014

(54) PIEZOELECTRIC BIMORPH SWITCH

(75) Inventors: Olaf Wunnicke, Eindhoven (NL); Klaus Reimann, Eindhoven (NL)

(73) Assignee: NXP B.V., Eindhoven (NL)

( * ) Notice: Subject to any disclaimer, the term of this patent is extended or adjusted under 35 U.S.C. 154(b) by 169 days.

(21) Appl. No.: 13/000,256

(22) PCT Filed: Jun. 18, 2009

(86) PCT No.: PCT/IB2009/052617
§ 371 (c)(1),
(2), (4) Date: Feb. 2, 2011

(87) PCT Pub. No.: WO2009/153757
PCT Pub. Date: Dec. 23, 2009

(65) Prior Publication Data
US 2011/0120843 A1    May 26, 2011

(30) Foreign Application Priority Data

Jun. 19, 2008 (EP) ..................................... 08158624

(51) Int. Cl.
*H01H 57/00* (2006.01)
*H01L 41/09* (2006.01)

(52) U.S. Cl.
CPC ............. *H01H 57/00* (2013.01); *H01L 41/094* (2013.01)
USPC ............ 310/330; 310/331; 310/332; 310/359

(58) Field of Classification Search
USPC ................... 310/330, 331, 332, 359
See application file for complete search history.

(56) References Cited

U.S. PATENT DOCUMENTS

| 4,237,399 A * | 12/1980 | Sakamoto ...................... 310/317 |
| 4,553,061 A | 11/1985 | Germano |
| 4,595,855 A | 6/1986 | Farrall |
| 4,625,137 A | 11/1986 | Tomono |
| 4,742,263 A | 5/1988 | Harnden, Jr. et al. |
| 6,297,579 B1 | 10/2001 | Martin et al. |
| 7,098,577 B2 | 8/2006 | Mehta |
| 7,368,860 B2 * | 5/2008 | Wood et al. ................... 310/367 |
| 2002/0064001 A1 | 5/2002 | Shiraishi et al. |

(Continued)

FOREIGN PATENT DOCUMENTS

| EP | 1 672 654 A1 | 6/2006 |
| GB | 2 012 106 A | 7/1979 |
| WO | 94/27330 A1 | 11/1994 |
| WO | 2005/064634 A1 | 7/2005 |

OTHER PUBLICATIONS

International Search Report and Written Opinion for Int'l. Patent Appln. No. PCT/IB2009/052617 (Oct. 21, 2009).

*Primary Examiner* — Derek Rosenau
*Assistant Examiner* — Bryan Gordon

(57) ABSTRACT

The present invention relates to a piezoelectric bimorph switch, specifically a cantilever (single clamped beam) switch, which can be actively opened and closed. Piezoelectric bimorph switch are known from the prior art. Such a switch may be regarded as an actuator. Actuators are regarded as a subdivision of transducers. They are devices, which transform an input signal (mainly an electrical signal) into motion. Electrical motors, pneumatic actuators, hydraulic pistons, relays, comb drive, piezoelectric actuators, thermal bimorphs, Digital Micromirror Devices and electroactive polymers are some examples of such actuators. The switch of the invention comprises piezoelectric stack layers (121, 122), which form a symmetrical stack, wherein an electric field is always applied in the same direction as the poling direction of the piezoelectric layers.

20 Claims, 3 Drawing Sheets

(56) References Cited

U.S. PATENT DOCUMENTS

| | | |
|---|---|---|
| 2004/0056567 A1 | 3/2004 | Menzel |
| 2004/0075366 A1* | 4/2004 | Mehta ............................ 310/336 |
| 2004/0135472 A1 | 7/2004 | Kita et al. |
| 2005/0104478 A1* | 5/2005 | Xu et al. ........................ 310/331 |
| 2005/0151444 A1* | 7/2005 | Mehta ....................... 310/313 B |
| 2006/0285255 A1* | 12/2006 | Kawakubo et al. ............ 360/294 |
| 2008/0211353 A1* | 9/2008 | Seeley et al. ................... 310/359 |
| 2009/0211884 A1 | 8/2009 | Pelzer et al. |

* cited by examiner

PIEZOELECTRIC BIMORPH SWITCH

FIELD OF THE INVENTION

The present invention relates to a piezoelectric bimorph switch, specifically a cantilever (single clamped beam) switch, which can be actively opened and closed.

BACKGROUND OF THE INVENTION

Piezoelectric bimorph switches are known from the prior art. Such a switch may be regarded as an actuator. Actuators are regarded as a subdivision of transducers. They are devices, which transform an input signal (mainly an electrical signal) into motion. Electrical motors, pneumatic actuators, hydraulic pistons, relays, comb drive, piezoelectric actuators, thermal bimorphs, Digital Micromirror Devices and electroactive polymers are some examples of such actuators.

Microelectromechanical systems (MEMS) are the technology of the very small, and merge at the nano-scale into nanoelectromechanical systems (NEMS) and nanotechnology. MEMS are also referred to as micromachines (in Japan), or Micro Systems Technology—MST (in Europe). MEMS are separate and distinct from the hypothetical vision of Molecular nanotechnology or Molecular Electronics. MEMS are made up of components between 1 to 100 μm in size (i.e. 0.001 to 0.1 mm) and MEMS devices generally range in size from a 20 μm to a millimeter. They usually consist of a central unit that processes data, the microprocessor and several components that interact with the outside such as microsensors. At these size scales, the standard constructs of classical physics do not always hold true. Due to MEMS' large surface area to volume ratio, surface effects such as electrostatics and wetting dominate volume effects such as inertia or thermal mass.

Various piezoelectric devices have been disclosed in the prior art.

U.S. Pat. No. 4,742,263 discloses a switch wherein piezoelectric bimorph elements are used to provide many separately controllable, closely spaced switchable contacts. The element includes at least two oppositely extending fingers connected by a common spine. The element spine is mounted to a case with the fingers spaced from an inner case surface. Electronic circuit means are mounted on the element spine for applying a separate electrical potential to each of the element fingers. A separate movable electrical contact is disposed on each of the element fingers spaced from the spine and insulated from the means for applying the separate electrical potentials to the fingers. A separate stationary contact is provided on an inner case surface opposite each of the movable contacts. In operations, a separate electrical potential is applied to each of the element fingers for selectively causing each finger to deflect and force its movable contact into electrical connection with the opposing stationary contact.

This disclosure relates to a bimorph piezoelectric switch with two applied voltages to drive the cantilever up- or downwards; it discloses very general claims, but it does not disclose a semiconductor device, or a MEMS. Further the piezoelectric layer is driven against the poling direction of more than a specific amount of the coercive field. Thus the switch is not actively opened to increase the opening gap, which is an issue especially in MEMS switches. Without any voltage the switch is not closed, but has a much smaller opening gap.

U.S. Pat. No. 4,595,855 discloses a synchronously operable electrical current switching apparatus includes a controllable piezoelectric relay having movable electrical contacts, and means for controlling the relay so as to move the contacts and effect a change of state of the electrical connectivity between them. The apparatus also includes means for operating the controlling mechanism so as to substantially reduce arcing between the contacts. A relay, which is especially useful in the apparatus, utilizes a piezoelectric bender and a flexible member disposed adjacent to one of the flat surfaces of the bender. The flexible member is fixed to the bender so that bending motion of the bender causes corresponding movement of the flexible member. At least one first electrical contact is disposed on the flexible member, and an electrical conductor having at least one second electrical contact is disposed adjacent the flexible member on the side thereof opposite the side which is adjacent to the bender. The electrical conductor is fixed to the flexible member so that movement of the member causes a change in electrical connectivity between the first and second contacts, and so that the electrical conductor is electrically isolated from the first contact when the first and second contacts are in an open position. The relay may be enclosed in a conventional 16-pin dual-in-line integrated circuit package, and is particularly useful for switching circuits operating at household power line current levels.

The switching apparatus, however, does not relate to a semiconductor device, let alone a MEMS. Further, the proposed solution suffers from e.g. residual stress gradient, single clamped beams, etc. In fact only a bimorph is mentioned; such a bimorph does not have a stress gradient free cantilever over the whole operation temperature range.

U.S. Pat. No. 4,625,137 discloses a piezoelectric actuator using a bimorph element, comprising: a bimorph element having at least one pair of piezo elements respectively on two surfaces of a central electrode and an electrode formed on a surface of each piezo element which is opposite to a surface contacting the central electrode, the piezo elements formed on the two surfaces of the central electrode being polarized in the same direction with respect to a direction of thickness of the bimorph element; a drive input circuit arranged such that a cathode of a first directional voltage limiting circuit is connected to one electrode contacting a positively polarized surface of the piezo element whose negatively polarized surface contacts the central electrode, that an anode of a second directional voltage limiting circuit is connected to the other electrode contacting a negatively polarized surface of the piezo element whose positively polarized surface contacts the central electrode, that an anode of the first directional voltage limiting circuit and a cathode of the second directional voltage limiting circuit are commonly connected to constitute one drive input terminal, and that the central electrode serves as the other drive input terminal; a constant voltage source for applying a constant voltage to the drive input circuit; and a polarity switching circuit, arranged between the constant voltage source and the drive input circuit, for switching a polarity of the constant voltage source with respect to the one and the other drive input terminals of the drive input circuit.

This disclosure relates to a piezoelectric actuator using a piezoelectric bimorph; it mentions the problem of depolarization in case of series and parallel-switched bimorphs; it circumvents this problem by polarizing again the piezoelectric crystal after every depolarization. The disclosure relates to the polarity switching voltage supply to prevent depolarization. It does not relate to a semiconductor device, nor to a MEMS, Further, the layout of the switch is not mentioned as such.

U.S. Pat. No. 4,553,061 discloses a direct current latching relay comprised of bender-type piezoelectric drive members each of which is a three terminal member formed of two piezoelectric plate elements separated by a conductive plane. Each piezoelectric plate element is separately electrically charged with an input pulsed DC switching signal of the same polarity as the pre-poling field previously induced in the piezoelectric plate element. By electrically charging one of the piezoelectric plate elements with a switching signal electric field of the same polarity as the pre-poling field, the bender-type drive members are member made to bend in one direction. Alternatively, by charging the opposite plate of the drive member again with a direct current electric charging field of the same polarity as the pre-poling field previously induced in the plate, the bender-type drive member can be caused to bend in the opposite direction. The bender-type piezoelectric drive member when bent engages and drives a push rod which actuates a snap-action switching contact mechanism from either an open circuit state or to a closed circuit state or vice versa. Pulsed direct current charging fields are applied to the piezoelectric plate element of the bender-type drive member and a high resistance discharge resistor is connected across each of the piezoelectric plate members so as to automatically discharge the plate members shortly after their excitation. As a result, no long-term depolarization of the piezoelectric plate members occurs and because of the pulsed short-term nature of the charging fields, no long-term deformation (creep) develops in the plate elements over extended periods of usage of the relay.

The above piezoelectric bimorph driven direct current latching relay actuates only in poling direction. However, it relates to a macroscopic relay using snap action to create a latching relay; thus, this is a macroscopic switch which does not suffer from residual stress gradients; compensation of the thermal expansion coefficients is not mentioned; in this patent the actuation forces are increased by stacking several bimorphs, which is very challenging in present thin film technique, if possible at all. As such it does not relate to a semiconductor device, or to a MEMS.

U.S. Pat. No. 7,098,577 B2 discloses a piezoelectric switch for tunable electronic components comprising piezoelectric layers, metal electrodes alternated with the layers and contact pads. Cross voltages are applied to the electrodes, in order to obtain an S-shaped deformation of the switch and allow contact between the contact pads. Additionally, a further electrode can be provided on a substrate where the switch is fabricated, to allow an additional electrostatic effect during movement of the piezoelectric layers to obtain contact between the contact pads. The overall dimensions of the switch are very small and the required actuation voltage is very low, when compared to existing switches.

The piezoelectric switch describes series and parallel arrangements of a bimorph switch (see for instance FIG. 1-3, 7, 8): structured center electrodes to achieve an S form bending are shown. The switch does not compensate for the various effects mentioned e.g. above.

US2002064001 discloses a piezoelectric device comprises an integral body of piezoelectric material having a length and width greater than its thickness; wherein the device further includes, in contact with the body, respective pairs of electrodes, wherein the electrodes of each pair are opposed in the thickness direction, wherein the body deflects along said transverse direction when a voltage is applied to the electrode pair. The invention further provides a disk drive suspension and a head gimbal assembly.

US2004135472 discloses a method, wherein a piezoelectric element has an asymmetrical hysteresis characteristic of polarization-electric field different in absolute values between a coercive field of positive electric side and a coercive field of negative electric field side, and is polarized in the film thickness direction of the piezoelectric element and in a direction of smaller absolute value of the coercive field, and as a position control voltage Q1 for position control by ditorting the piezoelectric element in a direction orthogonal to the film thickness direction of the piezoelectric element, a voltage equivalent to an electric field of 0.4 or less of the coercive field value is applied in the film thickness direction of the piezoelectric element in a direction of larger absolute value of the coercive field. Further, a position control voltage Q2 for recovering from deterioration of polarization of the piezoelectric element is applied by superposing on the position control voltage Q1, or changing over with the position control voltage Q1, or while the position control voltage Q1 is not applied, and therefore recovering from deterioration of polarization characteristic, the displacement characteristic is stabilized for a long period of time.

WO9427330 discloses a bimorph apparatus having an extended range of displacement is disclosed herein. The bimorph apparatus is typical in that it includes a bimorph having a conductive vane sandwiched between first and second piezoelectric layers, free for movement in response to electrical signals applied thereto. The bimorph includes a driver circuit for developing a first potential drop across the first layer, which induces contraction thereof. In addition, however, a second driver circuit operates to develop a second potential drop different from the first potential drop across the second layer contemporaneous with development of the first potential drop, thereby inducing expansion of the second layer. In this way simultaneous contraction and expansion of the first and second layers results in extended displacement of the free portion of the bimorph in a first direction. The second driver circuit may be adapted to apply a third electrical signal to the second layer, and the first driver circuit implemented to apply a fourth electrical signal to the first layer simultaneously with application of the third signal to the second layer. In this manner extended movement of the free portion of the bimorph is induced in the opposite direction or some other second direction.

GB2012106 discloses an electro-mechanical transducer having a dielectric plate which is coated on opposite major surfaces with electrodes, and a base plate which is bonded to one of the major surfaces of the dielectric plate through the electrode and does not follow the shrinkage and expansion of the dielectric plate when a voltage is applied to the dielectric plate through the electrodes perpendicular thereto. The dielectric plate is made of a ceramic, which is in paraelectric phase or anti-ferroelectric phase at room temperature to avoid residual strain and displacement due to domain structure. Two ceramic plates may be bonded with a phosphor bronze base plate there between to form a bi-morph. Such transducer can be used to support a magnetic head in a video tape recorder.

None of these documents, however, disclose a stack compensating for thermal expansion coefficients and other effects mentioned above. Further, WO9427330 and GB2012106 do not relate to MEMS.

A disadvantage of typical bimorph actuators is that electric field is not always applied in the same direction as the poling direction of the piezoelectric layers. As a consequence depoling of the piezoelectric layer is present and the lifetime of the switch jeopardized.

Another main property of a typical prior art bimorph switch suffers from a bending moment and a high sensitivity to ambient temperatures, specifically if residual stresses are present in the layers and the temperature expansion coefficient is different across the layer stack, respectively.

Normally, a cantilever is not actively opened, and so the initial gap can not be chosen to be very small. Because this would lead to a high capacitive coupling in the open state, low self-pull in voltage (i.e. electrostatic closing of the switch by a high RF power) and small restoring forces. Small restoring forces will increase the probability for sticking of the contacts in the closed state due to adhesion forces.

Thus, the prior art bimorph switches exhibit one or more of the above disadvantages.

As a consequence there still is a need for improved bimorph actuators.

The present invention intends to solve one or more of the above mentioned problem, by providing an improved bimorph switch. The present switch, on the other hand, will remain to exhibit other advantages of prior art switches.

SUMMARY OF THE INVENTION

The invention relates to a Device comprising a MEMS, and a piezoelectric bimorph switch for operating the MEMS, which switch comprises piezoelectric layers, which piezoelectric layers form a symmetrical stack, wherein an electric field is always applied in the same direction as the poling direction of the piezoelectric layers.

DETAILED DESCRIPTION OF THE INVENTION

In a first aspect the invention relates to a Device comprising a MEMS, and a piezoelectric bimorph switch for operating the MEMS, which switch comprises piezoelectric layers (121, 122), which piezoelectric layers form a symmetrical stack, wherein an electric field is always applied in the same direction as the poling direction of the piezoelectric layers.

The term MEMS may in principal also refer to NEMS.

The piezoelectric layers may be formed from natural and man-made materials. These materials include naturally occurring crystals, such as berlinite ($AlPO_4$), cane sugar, quartz, Rochelle salt, topaz and tourmaline-group minerals. Man-made crystals such as gallium orthophosphate ($GaPO_4$), Langasite ($La_3Ga_5SiO_{14}$), man-made ceramics such as perovskites or tungsten-bronze structures, such as $KTiOPO_4$, $KTiOAsO_4$, $RTiOAsO_4$, $RTiOPO_4$, barium titanate ($BaTiO_3$), lead titanate ($PbTiO_3$), lead zirconate titanate ($Pb[Zr_xTi_{1-x}]O_3$ $0<x<1$), more commonly known as PZT, potassium niobate ($KNbO_3$), lithium niobate ($LiNbO_3$), lithium tantalate ($LiTaO_3$), sodium tungstate ($Na_xWO_3$), $Ba_2NaNb_5O_5$, $Pb_2KNb_5O_{15}$, semiconductors as AlN, GaN, or wurtzite GaAs, ZnO, CdS, CdSe, polymers such as polyvinylidene fluoride (PVDF), lead-free piezoceramics, sodium potassium niobate (KNN), and bismuth ferrite ($BiFeO_3$), and combinations thereof, are also applicable.

It is noted that in prior art switches, the residual stress and the differences in the thermal expansion coefficient have to be compensated by choosing a correct layer stack. By optimizing the layer stack, layer materials, layer thicknesses and so on, it might have been possible to nearly compensate the bending moment due to a gradient over the layers of the residual stress or the thermal expansion coefficient. To achieve this, the bending moments of both origins has to be canceled at the same time. For the residual stress of the layers this reads $$0 = \sum_{i=1}^{N} b_i t_i (Z_i - Z_N) \sigma_i \quad (1)$$

whereas i goes over all N layers with $b_i$, $t_i$, $Z_i$ and $\phi_i$ being the width, the thickness, the distance from the neutral layer plane and the residual stress of the i-th layer, respectively. $Z_N$ is the height of the neutral layer plane in the layer stack. If this equation is fulfilled, there is no gradient of the residual layer stress and thus no bending of the cantilever.

However, at the same time the gradient of the thermal expansion coefficient has to be cancelled. The condition for this is $$0 = \sum_{i=1}^{N} b_i t_i (Z_i - Z_N) E_i \alpha_i \Delta T_i \quad (2)$$

with $E_i$, $\alpha_i$, and $\Delta T_i$ being the Young's modulus, the thermal expansion coefficient and the temperature difference relative to a reference temperature of the i-th layer, respectively. Clearly the equations relate to very exceptional cases.

Although it is possible to find layer combinations, which fulfill both equations, it is easily to understand that the amount of combinations is very limited. Furthermore, the cantilever has to be also optimized with respect to other properties like contact force, switching speed, which is very challenging with these two equations.

The present invention compensates for residual stress in the bimorph. It is compensated because of the symmetric layer stack, that is variation between two comparable layers at each side of the mirror plane are, for each relevant parameter, such as thickness, composition, Youngs' modulus, etc. within 10% of each other, preferably within 2% of each other, more preferably within 1% of each other, even more preferably within 0.5% of each other, such as within 0.1% of each other. Throughout the present description, also the term "substantially" should be interpreted in a similar way. Additionally, in a preferred embodiment, the compensation can be fine-tuned either electrically, by applying a voltage on a specific layer, or mechanically, by adding one or more structural layers to the switch. Further, in a preferred embodiment, the present invention allows for compensation for temperature expansion coefficient, e.g. by choosing the right materials, or by applying a voltage on a specific layer. Also, in a preferred embodiment, the present invention allows for active opening of the switch, thereby providing a faster switching time, as well as less probability for sticking, and higher contact forces, which provide the present switch with clear advantages over the prior art. The present invention further increases contact force compared to state-of-the-art MEMS switches.

The present invention describes a piezoelectric bimorph cantilever (single clamped beam) switch, which can be actively opened and closed. A main difference with other bimorph actuators is that electric field is always applied in the same direction as the poling direction of the piezoelectric layers. This prevents depoling of the piezoelectric layer and enhances the lifetime of the switch.

Another main property of the bimorph is that the layer stack is completely or nearly completely mirror symmetric to the center of the stack, which center may comprise a neutral layer plane. This symmetry ensures that the residual stresses in the layers as well as temperature expansion coefficient mismatches are compensated. Thus, no bending of the cantilevers is obtained independent of the residual stress and the operating temperatures. This leads normally to a large initial bending moment and a high sensitivity to ambient temperatures.

Because the cantilever is actively opened the initial gap can be chosen to be relatively small. Normally, as in the prior art, a small initial gap would lead to a high capacitive coupling in the open state, low self-pull in voltage (i.e. electrostatic closing of the switch by a high RF power) and small restoring forces. Small restoring forces will increase the probability for sticking of the contacts in the closed state due to adhesion forces. On the contrary, by actively opening of the switch the open gap and the restoring forces are increased.

Because the initial gap is chosen to be smaller than normally used with piezoelectric MEMS switches, higher contact forces are obtained compared with these standard switches.

The basic geometry of this invention is a piezoelectric bimorph cantilever. A cantilever has a length, which is typically 50 to 200 times longer than its height. The width is around 3 to 40 times wider than its height. Typical heights are between 0.5 and 8 micrometers. The preferable height is around 1 to 3 micrometer. The cantilever is clamped at an anchor on one side, i.e., a single-clamped beam. The cantilever consists of several layers, which are exactly or at least nearly exactly symmetric to the optional center or neutral layer of the layer stack. In a preferred embodiment they are substantially symmetric with respect to the geometric (layer thickness and width) and material properties (Young modulus, residual stress, coefficient of thermal expansion) of the layers. The layer stack consists of two piezoelectric layers of the same or nearly the same thickness and with opposite oriented poling direction. In between these two piezoelectric layers is an optional structural or central layer. If no structural layer is present then there might be a thicker common electrode between the two piezoelectric layers, which also functions as a structural layer together with the not actuated piezoelectric layer. This structural layer itself can consist of one or several layers. It can among others consist of $Si_3N_4$, $SiO_2$, diamond, etc. Preferably it consists of a soft layer/hard layer stack or of a soft layer/hard layer/soft layer stack. With a soft layer a material with a low Young modulus preferably much below 200 GPa is meant, like $SiO_2$. Accordingly, a hard layer is a layer with a high Young modulus preferably above 200 GPa, like $Si_3N_4$ or diamond. If a combination of a hard and a soft layer is used than the hard layer has a thickness in the same order of magnitude as the soft layer; preferably 0.5 to 3 times thicker than the soft layer. The hard layer is preferably 2-6 times thicker than one of the piezoelectric layers. All exact optimum thicknesses depend on the Young's modulus of the layers. On both sides of the piezoelectric layer electrically conducting electrodes are present to provide a determined electric potential across the piezoelectric layers. The electric potential on these electrodes can be adjust by connections to the outside world. As an optional variation of this proposal, an additional layer can be deposited on top or even below the symmetric layer stack to adjust the neutral layer plane, residual stress or coefficient of thermal expansion. This might be needed because of always present process induced asymmetries like interface reactions, inter-layer diffusion etc. This can be also achieved by disturbing slightly the symmetry on purpose. Furthermore, there can be additional layers like a thick contact metallization at the tip of the cantilever to perform the electric contact in the closed state or a low-k layer to capacitive decouple the contact metallization from the actuation electrodes, usually the bottom electrode, and the piezoelectric layers. These layers are not drawn in any present drawing.

The present cantilever is actuated to open and to close the initial gap, and by that to close and open the electrical contact, by applying an electric field along the poling direction of one of the piezoelectric layer (e.g. the bottom piezoelectric layer). Only one piezoelectric layer is actuated at the same time, while the other also acts as part of the structural layer. To actuate the cantilever in the other direction (e.g. to open the switch) the electric field is applied over the other piezoelectric layer and now the first one functions as the structural layer.

It is noted that nearly in all instances, thin-films suffer from residual layer stress due to, e.g., the deposition process, interface reactions, diffusion. A drawback is that a gradient in the residual layer stress results in a bending moment and thus a bended cantilever. A clear disadvantage is that the amount of bending can easily exceed the initial gap. Furthermore, a further disadvantage is that the coefficient of thermal expansion is very different between the different layers, especially between metallic (usually high expansion coefficient) and covalent bonded layers (usually low expansion coefficient). Because in a preferred embodiment the switch must be operational at a large temperature range, say between −20 and 80 degrees Celsius, an asymmetry in these coefficients also leads to a bending moment with changing temperatures. This result in a self-closing switch or a switch with cannot be closed anymore. Because of the symmetry of the present layer stack, the effects of residual layer stress and coefficient of thermal expansions are zero or nearly zero. In this way also drift in the manufacturing process is compensated or nearly compensated, e.g. within 10%, preferably within 1%, such as within 0.1%.

Because the present cantilever is actively opened, the initial gap can be chosen to be relatively small. The preferable initial gap size lies between 0.1 and 1 micrometer [see Eq. (3)].

$$F_c = \frac{3}{2}\frac{M}{L} - \frac{3EIg}{L^3} \quad (3)$$

Here M is the bending moment due to the piezoelectric actuation, L the length of the cantilever, E*I effective bending stiffness of the layer stack of the cantilever, g the initial gap. Note that the contact force ($F_c$) must be equal or larger than zero. If $F_c$ is negative, the initial gap cannot be closed and thus no contact is made. This equation shows that the contact force increases for decreasing opening gaps and thus a higher contact force can be achieved. This leads automatically to a lower contact resistance. However, a small initial gap would lead to high capacitive coupling in the open state The low capacitive coupling is important for RF switches at high frequencies above 1 GHz to achieve an isolation better than −25 dB, which is a further advantage of the present invention. Furthermore, a small open gap (g) decreases drastically the self pull-in voltage (Vpi), at which the switch is closed by electrostatic actuation due to the voltage $V_{PI}$ on the signal lines:

$$V_{PI} = \sqrt{\frac{8kg^3}{27\epsilon_0 A}} \quad (4)$$

k is the effective spring constant of the cantilever, $\epsilon_0$ the permittivity of free space; A is the contact surface between top and bottom contact (FIG. 3). But in the present invention the opening gap is increased during operation by actively opening the switch and increasing so the opening gap. This decreases the capacitive coupling in increases the self pull-in voltage drastically, again providing a further advantage.

Additionally, because the cantilever stiffness and the initial gap determines the maximum forces with which the contacts can be pulled apart from each other (the larger the initial gap and the larger bending stiffness, the higher is the restoring force), a small initial gap would also leads to small restoring forces. By the active opening of the switch the restoring forces can be increased several times. Small restoring forces will increase the probability for sticking of the contacts in the closed state due to adhesion forces. There are also prior art switches, which open actively the switch by electrostatic actuation (vertical actuated). But these are challenging from processing point of view. As an optional variation of the present invention, solely active closing of the switch can also operate the switch. In the present case the second piezoelectric layer is only used to compensate for the gradients in the residual layer stress and coefficient of thermal expansion.

An active opening of the present switch will also decrease the switching time to open the switch, a further advantage. This can be understand simply by the higher forces involved in overcoming the adhesion forces and in moving the electric contacts and the cantilever apart from each other (inertia). Not-actively opened electrostatic switches can have opening times of 70 microseconds. Often it is desirable to operate a switch in hot-switching mode, i.e., opening and closing the switch while a current is flowing through the galvanic contacts due to an applied voltage. During closing and especially opening of the galvanic contacts electric discharge will occur which drastically decreases the lifetime of the switch because it melts partially the metallization or deforms the contact pairs. The shorter this time is, i.e., the faster the switch is closed and especially opened, the longer the lifetime of the switch in hot switching conditions will be.

Because the leaking currents through the piezoelectric layer are quite small (even in the nA and pA range) the power consumption to keep the switch in the open or in the closed state is in the nW (nanowatt) or pW (picowatt) range.

In a preferred embodiment the second piezoelectric layer can also be used to tune the initial gap of a tunable capacitor. In this case the gap between the electrical contacts is filled with a dielectric material (optional) and air. The distances between the electrodes determine the capacitance. By piezoelectric actuation the gap can be varied and thus the capacitance. Here one piezoelectric layer (e.g. the bottom piezoelectric layer) can be used to actuate the contact. The other one can be used either only passive (i.e. without actuating it and use it only for compensation of residual stress and temperature expansion) or actively to tune for small changes of the gap. These small changes might originate from processing variations (static) or ambient temperature changes (dynamic). These changes can be monitored by means of measuring the capacitance of an additional contact pair.

Another possible variation includes the possibility to additionally or solely use electrostatic actuation to close the switch and use the piezoelectric actuation to actively open the switch.

The cantilever switch needs not to be straight. Also corrugated structures are possible. In that case, symmetry is defined relating to all central points in the corrugated structure, having a substantially the same stack of layers on both sides of said central points.

The present bimorph also works when the piezoelectric layers are not poled. The reason for this is that the piezoelectric layers are not driven against the poling condition.

The present invention provides amongst others the following advantages, in addition to the ones already mentioned or to be mentioned:

no bending of the switch due to residual layer stress due to the symmetry of the layer stack; small remaining bending moments can be adjusted by an additional layer on top (or even below) the symmetric layer stack;

it can operate in a large operating temperature range due to compensation of the mismatch of the coefficients of thermal expansion across the layer stack;

no operation against the poling conditions and thus no depoling can occur, which reduces the life time of the switch;

actively open and closing the gap provided and so higher switching speeds and reduced probability for sticking of the contacts;

larger gap in the open state provided by actively opening the switch in operation and so higher self-pull in voltages, lower capacitive coupling in the open state;

small initial gap in the un-actuated state and thus a higher contact forces possible;

decreased opening switching time and so reduced period in which arching can occur during opening the switch in hot-switching conditions;

voltage compensation of process variation, ambient temperature, can be used for tunable capacitors;

in a preferred embodiment also electrostrictive materials (e.g. BST in the paraelectric phase, $SiO_2$, specifically polymer filled highly porous $SiO_2$ or electrostrictive polymers), can be used as the active actuation layer; this implies that throughout the invention the term piezoelectric layer also comprises electrostrictive materials.

All dielectric materials exhibit more or less strong electrostrictive behavior. It describes the effect that a crystal thereof is deforming when applying a (large) electric potential. No special crystal (group) symmetry is needed so that a material can show electrostriction as in case of piezoelectricity. While piezoelectricity is a linear effect with applied electric field, electrostriction is proportional to the square of the electric field. These materials can not be poled and thus there is no poling condition and no operation against a poling direction. As a further advantage, also these materials, apart from piezoelectric materials, can be applied in the present invention, because the invention is not making use of an operation against the poling direction of the piezoelectric material.

In a preferred embodiment the invention relates to a device according to the invention, wherein the symmetrical stack comprises a top layer (101), functioning as a top electrode, and a bottom layer (112), functioning as a bottom electrode, which top and bottom layers have a substantially equal thickness and are formed of substantially the same material.

In a further preferred embodiment the invention relates to a device according to the invention, wherein the symmetrical stack further comprises a center layer (130), functioning as a center electrode.

In a further preferred embodiment the invention relates to a device according to the invention, wherein the symmetrical stack further comprises an upper piezoelectric layer in between the top layer and optionally center layer, and a bottom piezoelectric layer in between the bottom layer and optionally center layer, which top and bottom piezoelectric layers have a substantially equal thickness and are formed of substantially the same material.

In a further preferred embodiment the invention relates to a device according to the invention, wherein the top electrode is electrically connected to a first voltage pole, the bottom electrode is electrically connected to a second voltage pole, wherein the center electrode is grounded, and wherein either the first voltage pole or the second voltage pole has a positive (or negative) potential, and wherein preferably the first voltage pole or the second voltage pole not having a positive potential is grounded.

In a further preferred embodiment the invention relates to a device according to the invention, further comprising a layer on top of the top electrode for optimizing neutral plane position and/or reducing a residual stress gradient, and an optional structural layer below the bottom electrode, preferably comprising a low-k material with a dielectric constant below 12, more preferably below 8, most preferably be below 4.

Advantages of the above preferred embodiments have been described in the description and drawings.

A preferred embodiment may thus comprise one or all of the preferred elements of claims 1-6.

In a second aspect the invention relates to a method of opening and closing a device according to any of claims 1-6, wherein a potential is applied to the top electrode to open the switch, and a potential is applied to the bottom electrode to close the switch, or vice versa.

In a preferred embodiment the present invention relates to a method, wherein the electrodes are not poled before opening and/or closing. Advantages hereof, specifically for thin layers, are e.g. that one process step is not needed, i.e. the step of poling. Typically such a process step is rather complicated and prone to errors. The risk of such errors is therefore smaller.

Further, the temperature of poling is typically relatively high, e.g. 200 C. Such a high temperature may damage an optional underlying device, chip, or electronics being present. Therefore, poling is not favored.

Also during poling accidentally closing of a switch may occur. A closed switch is difficult to open.

In a third aspect the invention relates to a piezoelectric bimorph switch for operating a MEMS, which switch comprises piezoelectric layers (121, 122), which piezoelectric layers form a symmetrical stack, wherein an electric field is always applied in the same direction as the poling direction of the piezoelectric layers.

In a fourth aspect the invention relates to a device, such as a piezo nanopositioning stage and/or scanner, fast steering mirror, beam deflector, piezo actuator in a stack, in a tube, in a shear or in a ring, piezo controller, piezo driver, ultrasonic piezo linear motor, or piezo material in general, comprising a piezoelectric bimorph switch according to the invention.

In a fifth aspect the invention relates to an application, such as a mobile device, such as a mobile phone, a PDA, GPS, comprising the present device. Because of the small dimensions, low power consumption and the very good RF performance (high linearity and isolation in the open state, low insertion losses in the closed state) the present invention is particularly suited for such applications.

As very high voltages correspond to only tiny changes in the width of the crystal, this width can be changed with better-than-micrometer precision, making piezo crystals the most important tool for positioning objects with extreme accuracy—thus their use in actuators.

A further application is a loudspeaker. Therein, voltages are converted to mechanical movement of a piezoelectric polymer film.

A yet further application is a piezoelectric motor: therein piezoelectric elements apply a directional force to an axle, causing it to rotate. Due to the extremely small distances involved, the piezo motor is viewed as a high-precision replacement for a stepper motor.

In an application present piezoelectric elements can be used in laser mirror alignment, where their ability to move a large mass (the mirror mount) over microscopic distances is exploited to electronically align laser mirrors. By precisely controlling the distance between mirrors, the laser electronics can accurately maintain optical conditions inside the laser cavity to optimize the beam output.

A related application is the acousto-optic modulator, a device that scatters light off of sound waves in a crystal, generated by piezoelectric elements. This is useful for fine-tuning a laser's frequency.

Further applications are atomic force microscopes and scanning tunneling microscopes employ converse piezoelectricity to keep the sensing needle close to the probe.

A yet further application is an inkjet printer: On some inkjet printers, particularly those made by Epson, piezoelectric crystals are used to control the flow of ink from the inkjet head to the paper.

Also an application is in a diesel engine: high-performance common rail diesel engines use piezoelectric fuel injectors, first developed by Robert Bosch LLC, instead of the more common solenoid valve devices.

The present invention is further elucidated by the following figures and examples, which are not intended to limit the scope of the invention. The person skilled in the art will understand that various embodiments may be combined.

DETAILED DESCRIPTION OF THE DRAWINGS

Figure 1A:
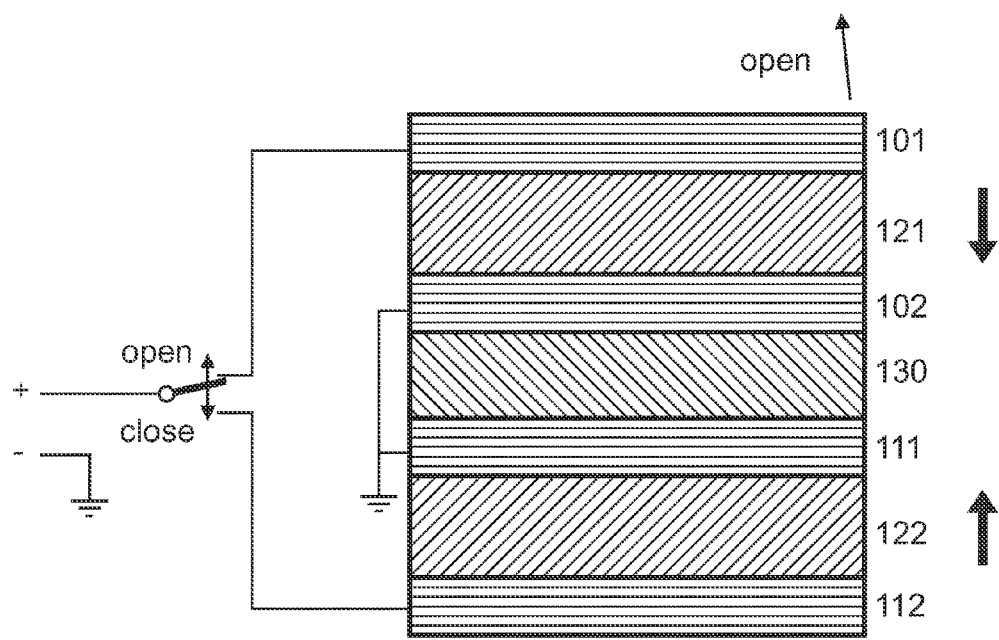
FIGS. 1A-1B show an embodiment of the present bimorph switch.
Figure 1B:
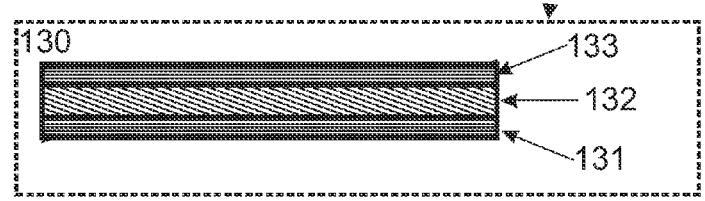

FIGS. 1A-1B show an embodiment of the present bimorph switch. Therein a top electrode (101), a bottom electrode (112) and two piezoelectric layers (121, 122) are present. Further, a central layer (102, 130, 111), forming a central electrode is present. As such a substantially symmetrical layer is formed, i.e. the thickness of layers (101) and (112), and those of layers (121) and (122), are substantially equal, respectively, and are formed of substantially the same material, respectively. This also holds for optional layers (102) and (111), being electrically conducting layers.

The central layer, forming one or optionally two electrodes, may be formed out of one layer (130), or a symmetrical stack of layers, e.g. (102), (130), and (111), respectively.

One electrical switch is used to open or close the bimorph switch. The switch poles a piezoelectric material, thereby actuating the switch in a certain direction. The center layer, e.g., layer 130 in FIG. 1A, also might consist of e.g.:

either a single conducting layer, i.e., the center electrode;

a splitted center electrode: a lower one CE1 and an upper one CE2 with a dielectric layer (DL) sandwiched in between both center electrodes;

this dielectric layer (DL) can itself again consist of several layers for instance a lower soft layer, a center hard layer and an upper soft layer. FIG. 1B shows for example, the layer 130 as a dielectric layer consisting of the lower soft layer 131, a center hard layer 132, and an upper soil layer 133.

Important for all possible center layer is that need to be symmetric or nearly symmetric with respect to their center layer plane to be in agreement with the claims of this invention. This point is not shown in the figures and thus not described here.

Figure 2:
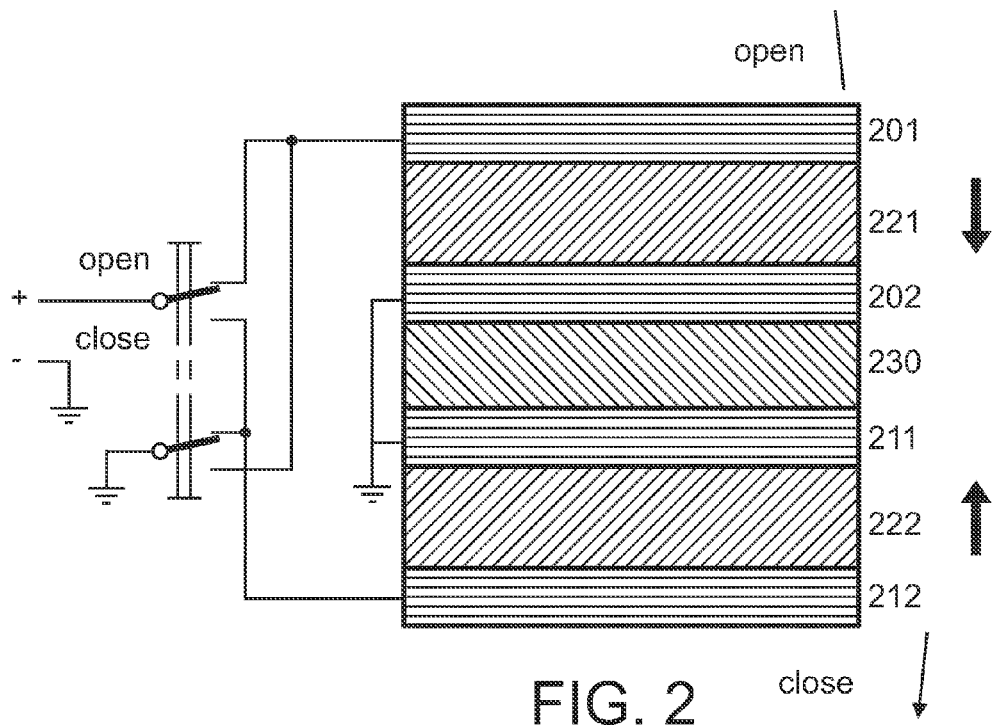
FIG. 2 shows an embodiment of the present bimorph switch.

FIG. 2 shows an embodiment of the present bimorph switch. Therein a top electrode (201), a bottom electrode (212) and two piezoelectric layers (221, 222) are present. Further, a central layer (202, 230, 211), forming a central electrode is present. As such a substantially symmetrical layer is formed, i.e. the thickness of layers (201) and (212), and those of layers (221) and (222), are substantially equal, respectively, and are formed of substantially the same material, respectively. This also holds for optional layers (202) and (211), being electrically conducting layers.

The central layer, forming one or optionally two electrodes, may be formed out of one layer (230), or a symmetrical stack of layers, e.g. (202), (230), and (211), respectively.

Two electrical switches are used to open or close the bimorph switch. The switch poles a piezoelectric material, thereby actuating the switch in a certain direction. By using two switches, either the top electrode (201) or the bottom electrode (212) is attached to earth, whereas the other electrode (201, 212) is attached to power. As a consequence, one of the piezoelectric layers is short-circuited. In this case this piezoelectric layer is mechanical stiffer than when both electrodes are left floating as shown in FIG. 1. This effect is also called piezoelectric stiffening.

Figure 3:
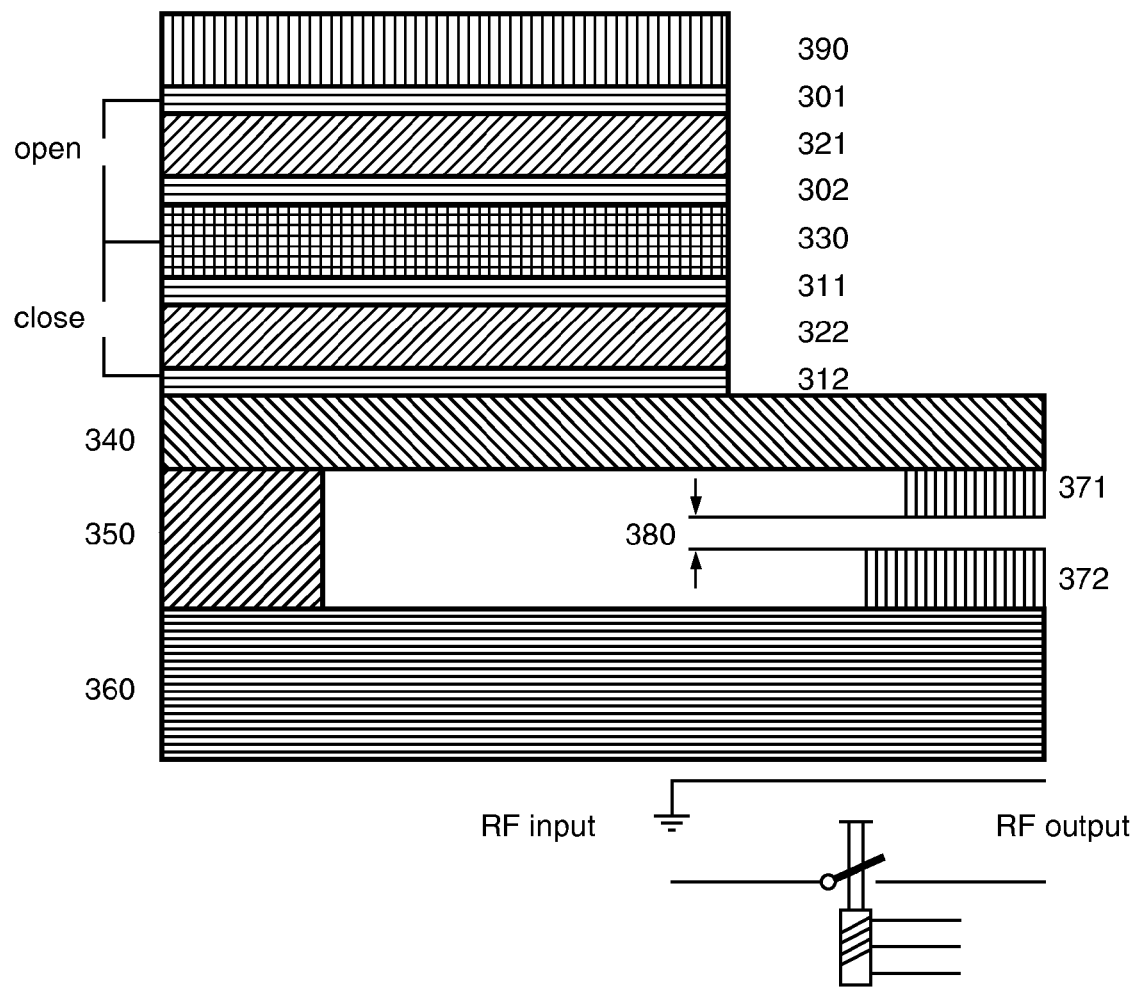
FIG. 3 shows a MEMS comprising an embodiment of the present bimorph switch.

FIG. 3 shows a MEMS comprising an embodiment of the present bimorph switch. Therein a top electrode (301), a bottom electrode (312) and two piezoelectric layers (321, 222) are present. Further, a central layer (302, 330, 311), forming a central electrode is present. As such a substantially symmetrical layer is formed, i.e. the thickness of layers (301) and (312), and those of layers (321) and (322), are substantially equal, respectively, and are formed of substantially the same material, respectively. This also holds for optional layers (302) and (311), being electrically conducting layers.

The central layer, forming one or optionally two electrodes, may be formed out of one layer (330), or a symmetrical stack of layers, e.g. (302), (330), and (311), respectively.

Further, an optional layer (390) is present, in order to optimize neutral plane position and the residual stress gradient.

The MEMS further comprises a top contact (371) and a bottom contact (372). The bimorph switch activates these contacts. If opened, the contacts are at a spacing (380).

The bimorph switch is present in a layer (340) comprising a low-k material, in order to decouple contact metallization from the actuation electrodes. The layer (340) rests on an anchor (350), which anchor rests on a substrate (360), typically being silicon.

One or more electrical switches are used to open or close the bimorph switch. The one or more switches pole a piezoelectric material, thereby actuating the switch in a certain direction.

Figure 4:
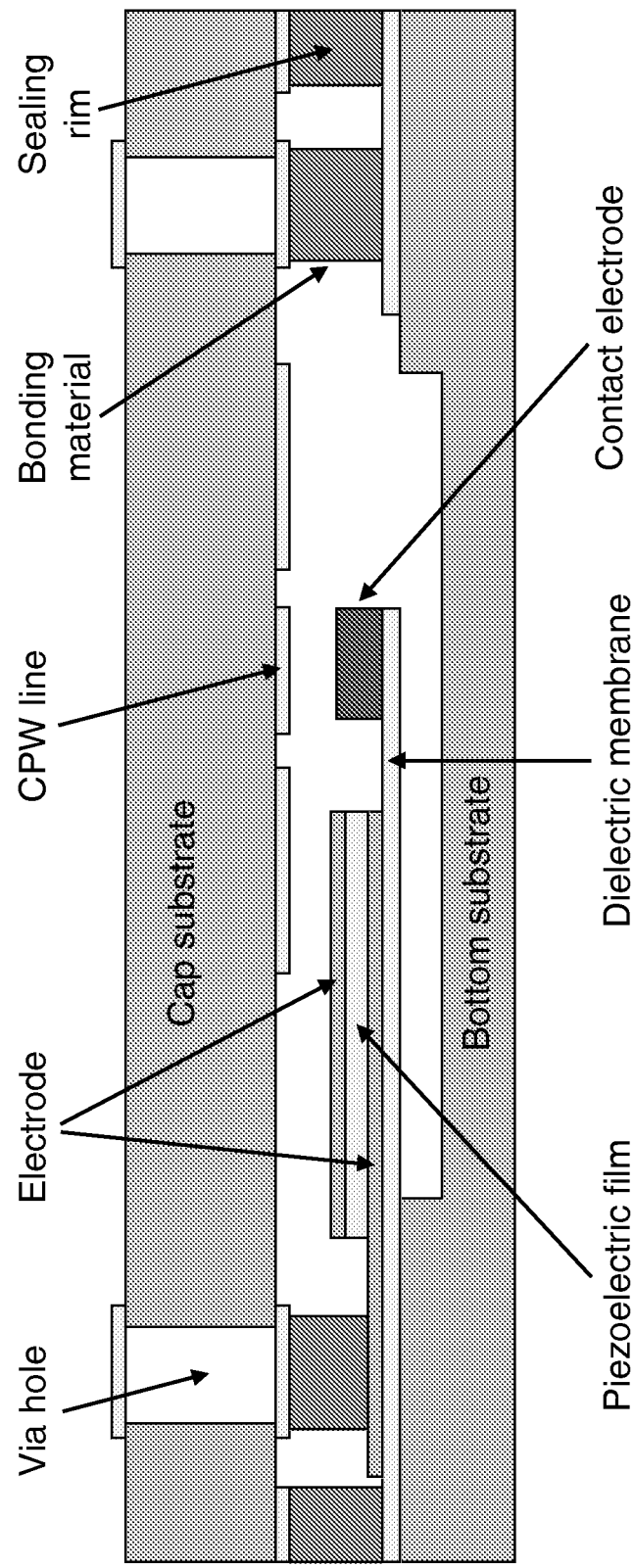
FIG. 4 shows a prior art MEMS.

FIG. 4 shows a prior art MEMS. The general principles thereof, e.g. encapsulation, bonding, via's, sealing and CPW line, are also valid for the present invention. The MEMS comprises a bottom substrate, a dielectric membrane, two electrode layers with a piezoelectric film in between said layers, a via, a cap substrate, bonding material, a sealing ring, and a CPW line.

The invention claimed is:

1. Device comprising:
a microelectromechanical system (MEMS),
a piezoelectric bimorph switch for operating the MEMS, the piezoelectric bimorph switch including a plurality of piezoelectric layers, which include a first piezoelectric layer having a first poling direction and a second piezoelectric layer having a second poling direction that is different from the first poling direction, the plurality of piezoelectric layers forming a symmetrical stack, and one or more electrical switches configured and arranged to:
open the piezoelectric bimorph switch by applying a first electric field, having a direction that is the same as the first poling direction, to the first piezoelectric layer, and
close the piezoelectric bimorph switch by applying a second electric field, having a direction that is the same as the second poling direction, to the second piezoelectric layer.

2. Device according to claim 1,
further including an electrode,
wherein the symmetrical stack includes a cantilever configured and arranged to close by flexing toward and contacting the electrode in response to the application of the second electric field, and to open by flexing away from the electrode in response to the application of the first electric field and therein breaking electrical contact with the electrode, and
wherein the cantilever includes:
a top layer, functioning as a top electrode;
a bottom layer, functioning as a bottom electrode;
a center layer, configured and arranged as a center electrode;
the first piezoelectric layer in between the center layer and the top layer; and
the second piezoelectric layer in between the center layer and the bottom layer.

3. Device according to claim 2, wherein the first and second piezoelectric layers have substantially equal thicknesses and are formed of substantially a same material, and the top and bottom layers have substantially equal thicknesses and are formed of substantially a same material.

4. Device according to claim 2, wherein the top electrode is electrically connected to a first voltage pole, the bottom electrode is electrically connected to a second voltage pole, wherein the center electrode is grounded, and wherein the device is configured and arranged to individually apply a positive potential to each of the first voltage pole and the second voltage.

5. Device according to claim 2, further comprising a layer on top of the top electrode configured and arranged to reducing a residual stress gradient.

6. Method of opening and/or closing a device according to claim 2, the method comprising:
applying a potential to the top electrode to open the bimorph switch by bending the cantilever away from the electrode, and
applying the potential to the bottom electrode to close the bimorph switch by bending the cantilever toward and contacting the electrode.

7. Method according to claim 6, wherein the electrodes are not poled before at least one of opening and closing.

8. Piezoelectric bimorph switch for operating a MEMS, which switch comprises:
a plurality of piezoelectric layers, which piezoelectric layers form a symmetrical stack,
electrical switches configured and arranged to close the piezoelectric bimorph switch by applying an electric field to one of the piezoelectric layers and no electric field to another piezoelectric layer, and using the electric field to bend the piezoelectric bimorph and cause the piezoelectric bimorph to contact an electrode via the bending, wherein the direction of the electric field is the same as a polling direction of the one of the piezoelectric layers to which the electric field is applied.

9. Device, which is at least one of a piezo nanopositioning stage and/or scanner, a fast steering mirror, a beam deflector, a piezo actuator in one of a stack, a tube, a shear and a ring, a piezo controller, a piezo driver, a ultrasonic piezo linear motor, and a piezo material in general, comprising a piezoelectric bimorph switch, the device configured to operate the piezoelectric bimorph switch according to the method of claim 7.

10. A device according to claim 1, included in one of a mobile device, a mobile phone, a PDA, and a GPS.

11. A device according to claim 4, wherein the device is configured and arranged to ground the first voltage pole when applying the positive potential to the second voltage pole and to ground the second voltage pole when applying the positive potential to the first voltage pole.

12. A device according to claim 5, further comprising a structural layer comprising a low-k material below the bottom electrode.

13. A device comprising:
a microelectromechanical system (MEMS),
a piezoelectric bimorph switch for operating the MEMS, the piezoelectric bimorph switch including:
a plurality of piezoelectric layers arranged in a symmetrical stack, the plurality of piezoelectric layers including a first piezoelectric layer having a first poling direction and a second piezoelectric layer having a second poling direction that is opposite from the first poling direction, and
one or more electrical switches configured and arranged to:
open the piezoelectric bimorph switch by applying a first electric field, having a direction that is the same as the first poling direction, to the first piezoelectric layer, and
close the piezoelectric bimorph switch by applying a second electric field, having a direction that is the same as the second poling direction, to the second piezoelectric layer.

14. Device according to claim 2, wherein the center layer includes:
a first electrical conducting layer;
a second electrical conducting layer electrically connected to the first electrical conducting layer, the first and second electrical conducting layers configured and arranged to function as the center electrode; and
a dielectric layer in between the first and second electrical conducting layers.

15. Device according to claim 14, wherein the dielectric layer includes:
a lower soft layer;
a center hard layer; and
an upper soft layer.

16. The device of claim 1, wherein the symmetrical stack is configured and arranged to
close in response to the application of the second electric field by bending toward and maintaining a closed position in which the symmetrical stack contacts an electrode, and
open in response to the application of the first electric field by bending away from the electrode and maintaining an open position in which the symmetrical stack is not in contact with the electrode.

17. The device of claim 13, wherein the MEMS includes a first electrode and a second electrode, the second electrode being coupled to the piezoelectric bimorph switch, and the piezoelectric bimorph switch is configured and arranged to
open in response to the first electric field by moving the second electrode away from the first electrode, and
close in response to the second electric field by moving the second electrode toward the first electrode and contacting the second electrode to the first electrode.

18. The device of claim 17, wherein the piezoelectric bimorph switch is configured and arranged with the one or more electrical switches to
hold the piezoelectric bimorph switch in an open position by using the first electric field to flex the piezoelectric layers and hold the second electrode in a position that is separated from the first electrode, and
hold the piezoelectric bimorph switch in a closed position by using the second electric field to flex the piezoelectric layers and hold the second electrode in contact with the first electrode.

19. The device of claim 13, wherein the symmetrical stack includes a cantilever configured and arranged to bend in a first direction and open the one or more switches in response to the first electric field, and to bend in a second direction and close the one or more switches in response to the application of the second electric field, the cantilever including:
a top layer, configured and arranged as a top electrode;
a bottom layer, configured and arranged as a bottom electrode;
a center layer, configured and arranged as a center electrode and including:
a first electrical conducting layer;
a second electrical conducting layer electrically connected to the first electrical conducting layer, the first and second electrical conducting layers configured and arranged as the center electrode; and
a dielectric layer in between the first and second electrical conducting layers;
the first piezoelectric layer being between the center layer and the top layer; and
the second piezoelectric layer being between the center layer and the bottom layer.

20. The device of claim 19, wherein one of the electrodes moves away from another of the electrodes to open in response to the first electric field.

* * * * *